United States Patent
Takahashi et al.

[11] Patent Number: 6,106,923
[45] Date of Patent: Aug. 22, 2000

[54] VENTING HOLE DESIGNS FOR MULTILAYER CONDUCTOR-DIELECTRIC STRUCTURES

[75] Inventors: Yasuhito Takahashi, San Jose; Solomon I. Beilin, San Carlos; Michael G. Peters, Santa Clara, all of Calif.

[73] Assignee: Fujitsu Limited, Japan

[21] Appl. No.: 08/859,642

[22] Filed: May 20, 1997

[51] Int. Cl.$^7$ .............. B32B 3/10; H01L 23/48; H05K 1/00
[52] U.S. Cl. .............. 428/131; 174/254; 257/786; 428/134; 428/136; 428/137; 428/138
[58] Field of Search .............. 428/131, 134, 428/136, 137, 138; 174/254, 260, 261; 361/777, 779, 818; 439/941; 257/728, 786

[56] References Cited

U.S. PATENT DOCUMENTS

| | | | |
|---|---|---|---|
| 4,061,263 | 12/1977 | Ohlstein | 228/124 |
| 4,201,616 | 5/1980 | Chellis et al. | 156/307.1 |
| 4,350,545 | 9/1982 | Garabedian | 156/87 |
| 4,394,953 | 7/1983 | Sonnweber et al. | 228/124 |
| 4,409,278 | 10/1983 | Jochym | 428/163 |
| 4,522,667 | 6/1985 | Hanson et al. | 156/87 |
| 4,769,269 | 9/1988 | Johnson et al. | 428/131 |
| 4,916,260 | 4/1990 | Broaddus et al. | 174/268 |
| 4,954,386 | 9/1990 | Mizunoya et al. | 428/137 |
| 5,061,547 | 10/1991 | Plesinger et al. | 428/209 |
| 5,189,261 | 2/1993 | Alexander et al. | 174/263 |
| 5,382,505 | 1/1995 | Schmidt | 430/313 |
| 5,672,407 | 9/1997 | Beckett | 428/137 |
| 5,763,060 | 6/1998 | Kerrick | 428/209 |
| 5,793,098 | 8/1998 | Uchida | 257/665 |

FOREIGN PATENT DOCUMENTS

| | | |
|---|---|---|
| 0 063 408 A1 | 10/1982 | European Pat. Off. . |
| 63-070442 | 3/1988 | Japan . |
| 6-132442 | 5/1994 | Japan . |
| 7-226452 | 8/1995 | Japan . |
| 2 080 729 | 2/1982 | United Kingdom . |
| 2 099 742 | 12/1982 | United Kingdom . |
| WO 84/01470 | 4/1984 | WIPO . |

*Primary Examiner*—Nasser Ahmad
*Assistant Examiner*—Derek Jessen
*Attorney, Agent, or Firm*—Coudert Brothers

[57] ABSTRACT

Disclosed are venting hole structures suitable for AC grounding planes in multichip modules (MCMs) and the like. Such structures may be constructed from alternating layers of metal and dielectric materials, such as copper and polyimide, respectively. The venting structures according to the present invention are formed in the metal layers of grounding planes and enable gases trapped within the underlying dielectric layers to escape (so as to prevent delamination) without disturbing the function of the AC grounding plane to provide controlled impedance characteristics for signal lines disposed above and below the grounding plane.

23 Claims, 5 Drawing Sheets

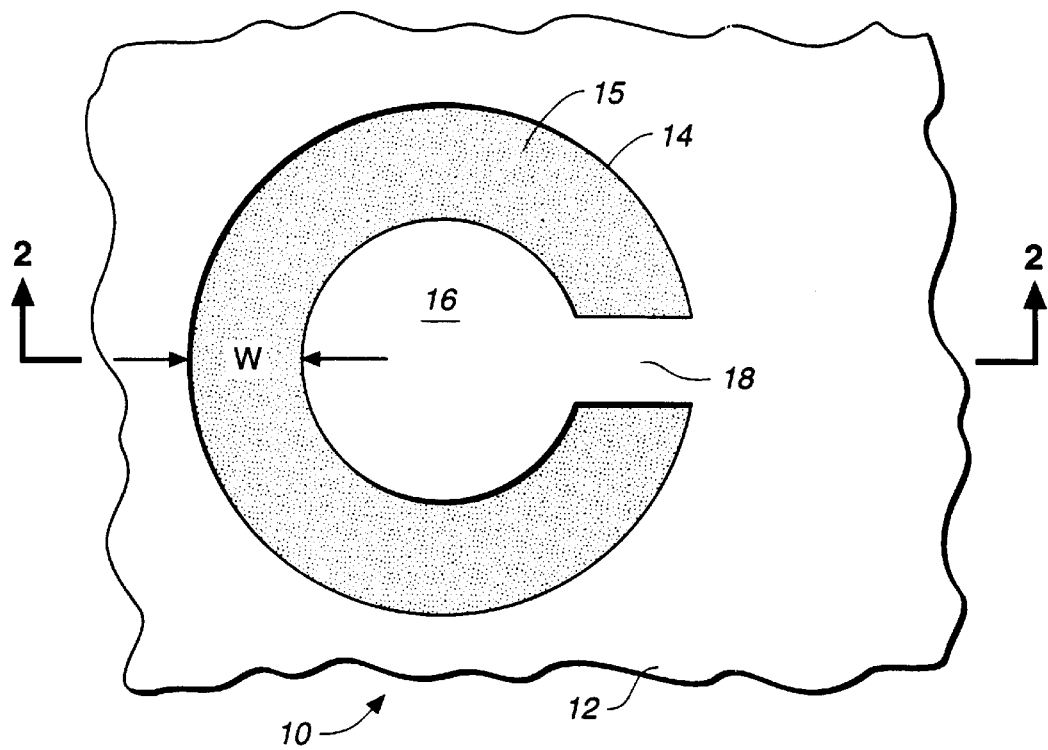
FIG._1
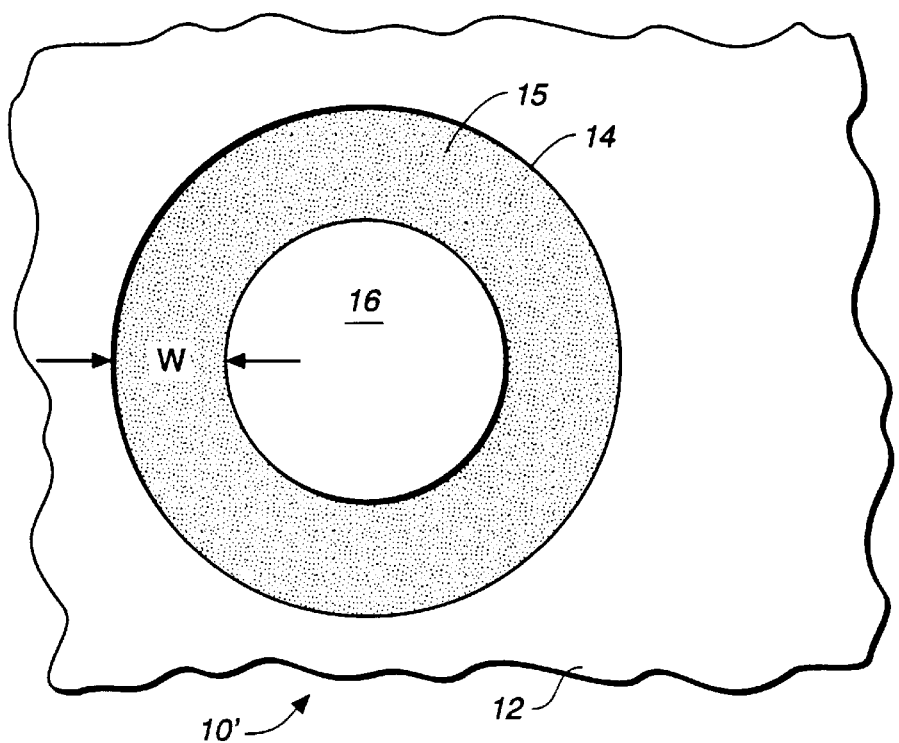
FIG._10

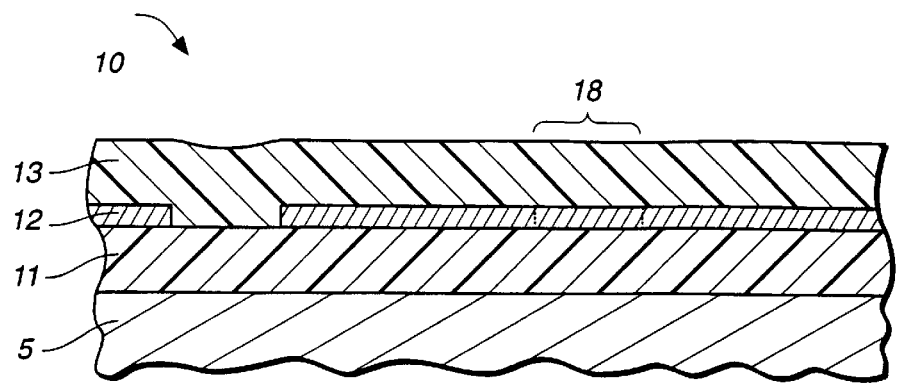
FIG._2
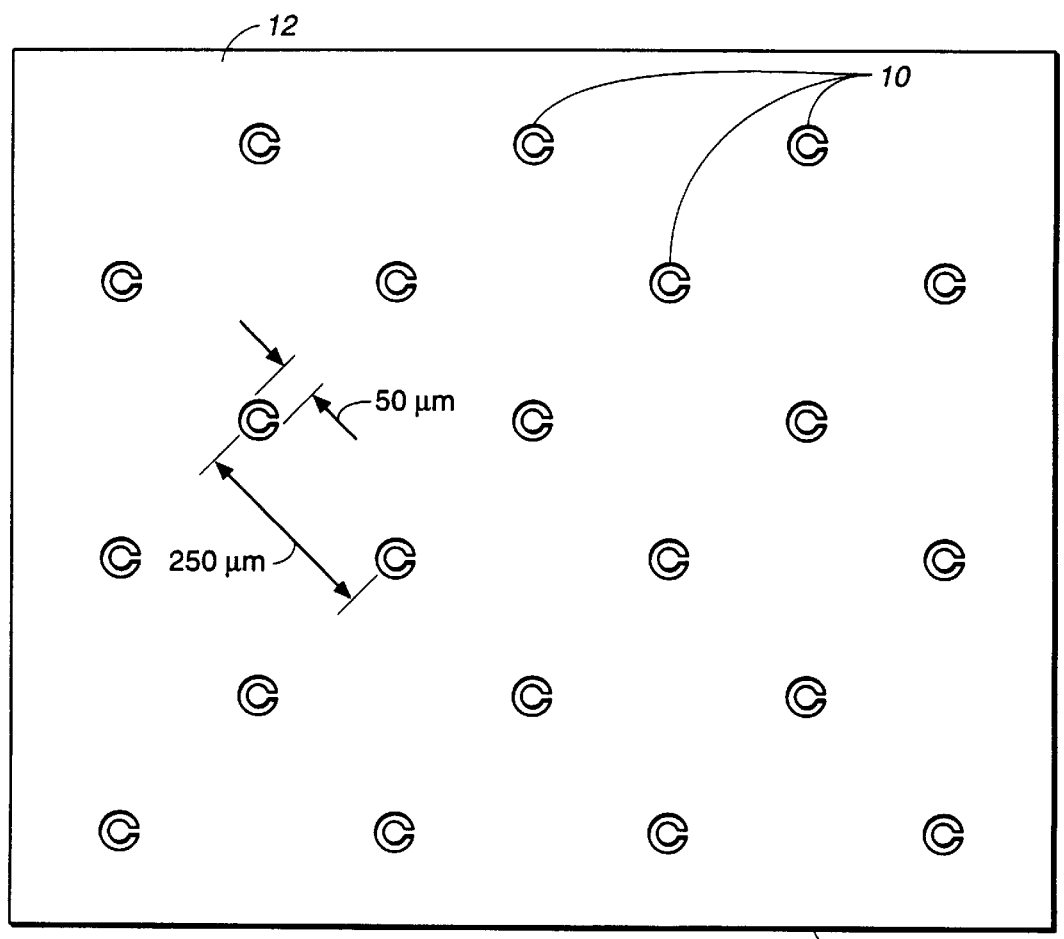
FIG._3

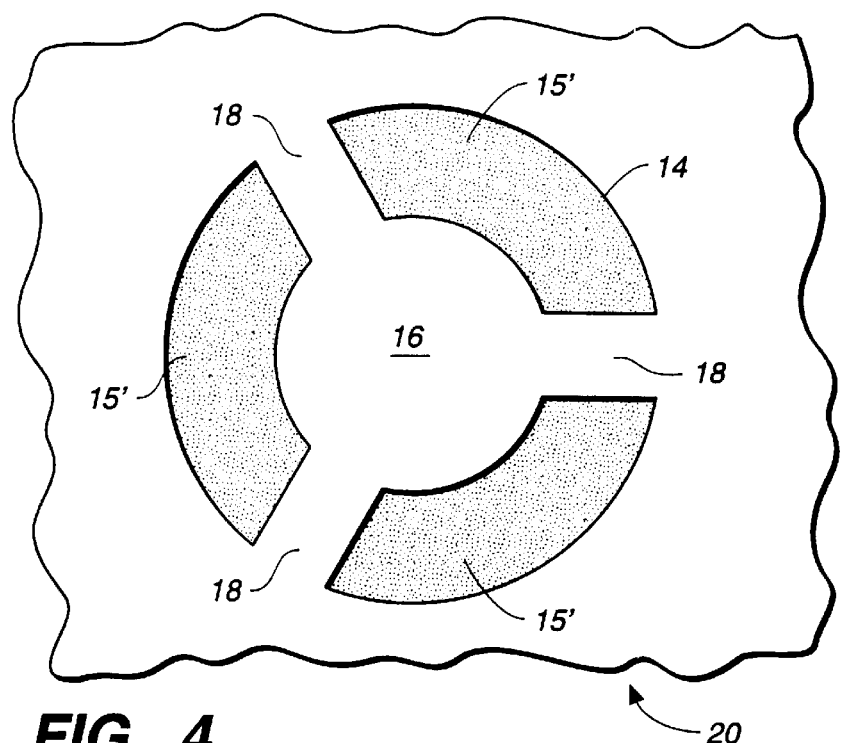
FIG._4
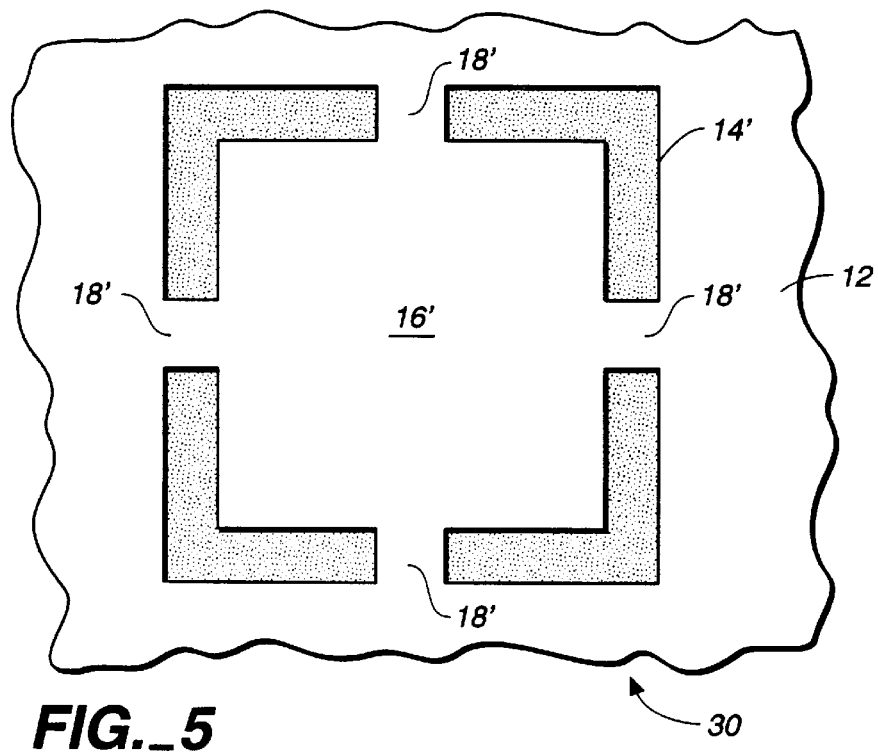
FIG._5

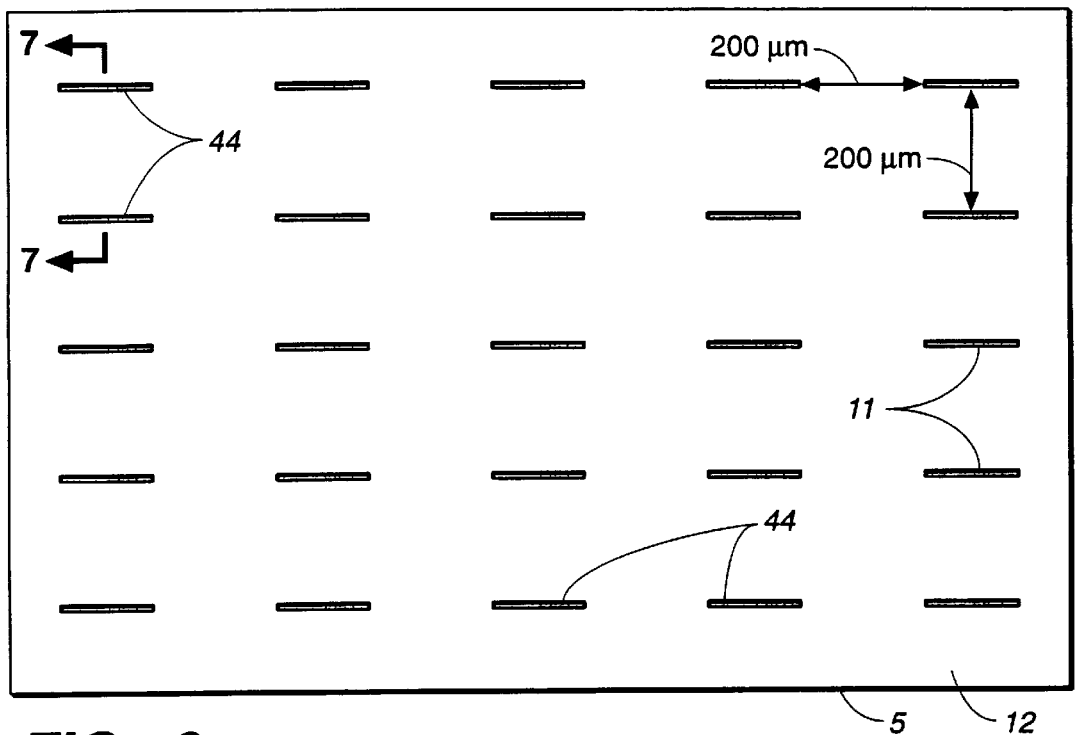
FIG._6
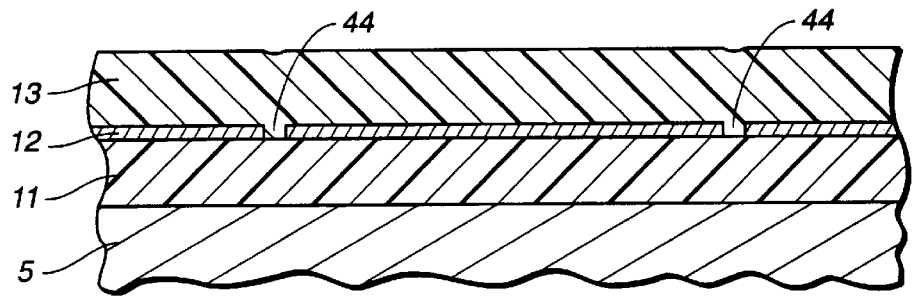
FIG._7

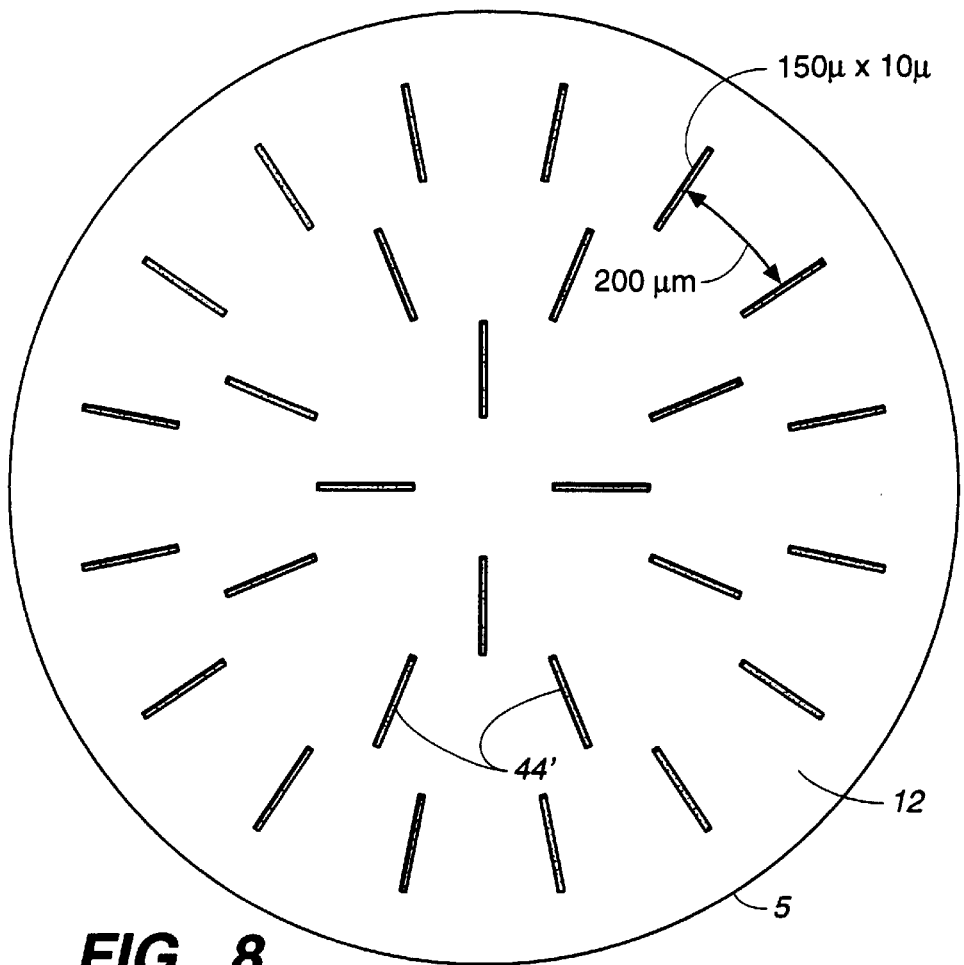
FIG._8
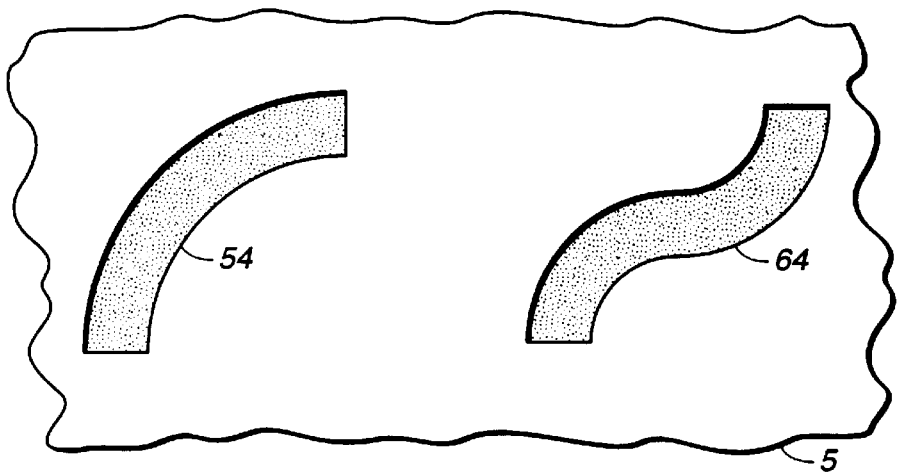
FIG._9

VENTING HOLE DESIGNS FOR MULTILAYER CONDUCTOR-DIELECTRIC STRUCTURES

FIELD OF THE INVENTION

The present invention relates to the construction of multilayer conductor-dielectric structures that may be found in Multichip Modules (MCMs) and the like, and more specifically to preventing delamination of layers in such structures.

BACKGROUND OF THE INVENTION

Many interconnect structures found in the electronic industry comprise alternating layers of dielectric material and metal. One common interconnect structure comprises alternating layers of a polymeric material, such as polyimide, and copper. Such structures usually begin with a base substrate, such as a silicon wafer, which is coated with a layer of polyimide using a spin-on coating process, much like that used to apply a photoresist layer. Thereafter, the starting polyimide layer is soft baked, and then cured. The curing step imidizes (i.e., cross-links) the polymer chains of the polyimide material. The polyimide may be cured by exposure to heat, ultraviolet light, electron beam radiation, or a combination thereof.

A metal layer is then formed over the starting polyimide layer and patterned to provide the desired electrical interconnects for that layer. The metal layer may be formed by sputter coating a seed layer of material, such as chromium, followed by an electroplating process. The resulting metal layer may then be patterned by selectively etching the material through a patterned photoresist layer, as is well known in the semiconductor processing art. A second polyimide layer is then formed over the first metal layer, and then soft baked. However, before curing the second polyimide layer, the layer is usually patterned to form vias, or apertures, through the second polyimide layer to parts of the underlying first metal layer. These vias will enable vertical electrical connections to be made between signal lines in the first metal layer, and signal lines in a second metal layer which will be subsequently formed over the second polyimide layer. The vias may be made by the conventional photoresist/etching steps, or a photo-imageable polyimide may be used. The vias are then filled with metal, which may be done by an electroless plating or electroplating process. Thereafter, a second metal layer is formed and patterned, which may be done with the same steps used to form and pattern the first layer. The number of polyimide and metal layers constructed depends upon the design and purpose of the structure.

The multilayer ceramic art, which is a more mature technology, has a similar structure of alternating dielectric and metal layers. The dielectric layers are raw, un-fired sheets of ceramic material (so-called "green-sheets"), upon which the metal layers are formed by screening metallic paste over the raw sheets through patterns. After screening, the raw sheets are pressed together and heated to a high temperature to cure the raw sheets. The heating process is known as a "firing" step. In addition to signal lines, the multilayer ceramic structures use AC ground planes on either side of one or more of the metal signal layers, with a dielectric ceramic layer separating each AC grounding plane from each metal signal layer. These AC grounding planes are used to provide each signal line with a controlled impedance characteristic, and to reduce the coupling of electromagnetic energy between adjacent signal lines (so called "cross-talk") by establishing a desired electromagnetic field pattern between each signal line and the AC grounding layers. The controlled impedance characteristic also enables the designer to better estimate the signal propagation characteristics of the signal lines. The design of such structures is well known in the microstrip and slot-line arts, which are part of the electromagnetic wave propagation art.

Difficulty has been encountered in incorporating these AC grounding planes into metal/polyimide structures. The difficulty results from the fact that the polyimide layers readily absorb water at room temperature, and readily release the water as steam when the structure is heated, which may occur during operation of the substrate in the field from the power dissipation of integrated circuit components which are attached to the substrate. For polyimide layers which are disposed between two AC ground planes, the heated steam is trapped between the two metal layers and cannot readily escape. The steam accumulates in small pockets at the interfaces between metal and dielectric layers, where it builds up pressure. With sufficient pressure, the layers delaminate (e.g., separate at the interface) and weaken the structure. In the delamination process, the control impedance for the surrounding signal lines is disturbed, causing loss of a predictable behavior in the signal propagation characteristics, and some signal lines may even be ruptured, or broken. Moreover, cavities can develop between the metal and dielectric layers due to the delamination process. Steam can condense within these cavities, which act as a reservoirs, or "pools", of condensed water having dissolved ionic species therein. This condensed water can initiate conductor corrosion and device failure.

The above delamination process may also occur when an upper polyimide layer is being cured by a heat treatment, or by other heat treatments which may be needed in the manufacturing of the multilayer substrate. In addition to releasing steam, polyimide layers which may not have been fully cured may release gases that are generated as part of the imidization process. Additionally, various photo-active compounds in photo-imageable polyimides may undergo decompositions which create additional gases. Most other types of polymeric materials suffer the above same problems, so that switching to a different type of dielectric material does not solve the above problems.

The present invention seeks to alter the design of AC grounding planes, and similar structures such as power distribution planes, so as to prevent delamination of layers in such structures.

SUMMARY OF THE INVENTION

In their invention, the inventors have recognized that the build up of gases within polymeric layers, such as polyimide, can be prevented by providing venting apertures, or holes, within the AC grounding planes (and the like). However, the inventors further recognize that the diameter needed by such holes to vent the gases is relatively large, which causes at least two problems. First, the large diameter reduces the planarity of the dielectric layer which overlies the grounding plane. Second, the apertures can create disturbances in the electromagnetic field lines between the metal signal lines and the AC grounding planes, and thereby ruin the ability of the grounding plane to provide a controlled impedance characteristic and to prevent signal "cross-talk." The latter problem is most noticeable for signals which are transmitted at frequencies of 200 MHz and above.

The inventors have addressed these disadvantages with embodiments for venting apertures which are described below and claimed herewith.

BRIEF DESCRIPTION OF THE DRAWINGS

FIG. 1 is a top plan view of a first embodiment of a venting structure according to the present invention.

FIG. 2 is a partial cross-sectional view of the embodiment shown in FIG. 1 according to the present invention taken along the line 2—2 shown in FIG. 1.

FIG. 3 is a top plan view of an array of venting structures shown in FIGS. 1 and 2 according to the present invention.

FIG. 4 is a top plan view of a second embodiment of a venting structure according to the present invention.

FIG. 5 is a top plan view of a third embodiment of a venting structure according to the present invention.

FIG. 6 is a top plan view of a fourth embodiment of a venting structure according to the present invention.

FIG. 7 is a partial cross-sectional view of the embodiment shown in FIG. 6 according to the present invention taken along the line 7—7 shown in FIG. 6.

FIG. 8 is a top plan view showing a radial arrangement of venting structures shown in FIGS. 6 and 7.

FIG. 9 is a top plan view of additional embodiments of venting structures according to the present invention.

FIG. 10 is a top plan view of a yet another embodiment of a venting structure according to the present invention.

DETAILED DESCRIPTION OF THE INVENTION

FIG. 1 shows a top plan view of a first embodiment of a venting structure 10 according to the present invention, and FIG. 2 shows a cross-sectional view thereof along the line 2—2 shown in FIG. 1. Referring to both FIGS. 1 and 2, the venting structure 10 is formed within a metal layer 12, which may serve as an AC grounding plane or power distribution plane, or the like. Metal layer 12 is disposed upon a dielectric layer 11, which is in turn disposed upon a silicon substrate 5, or the like. In preferred embodiments of the present invention, dielectric layer 11 comprises a polymeric material, such as polyimide, and metal layer 12 comprises a highly conductive material, such as copper. A second dielectric layer 13, preferably comprising a polymeric material or polyimide, is disposed upon metal layer 12. Venting structure 10 comprises an aperture 14 formed in metal layer 12. Aperture 14 may have any shape, and has a perimeter which encompasses its shape. Within aperture 14 lies a conductive pad 16, which may be electrically coupled to metal layer 12 by a conductive bridge, or path, 18. Pad 16, bridge 18, and metal layer 12 may all be formed in the same processing step and may comprise the same material. In a preferred construction, these components are formed by forming a blanket layer of metal over the entire exposed portion of dielectric layer 11, and thereafter patterning the blanket layer to define aperture 14, pad 16 and bridge 18 within layer 12.

Conductive pad 16 preferably comprises at least approximately 30 percent of the area of aperture 14. In some implementations of venting structure 10, pad 16 may comprise approximately 50 percent or more of the area within aperture 14, and approximately 80 percent or more, particularly for venting holes with diameters which are larger than about 100 μm. An annular shaped gap 15 is formed between aperture 14 and the combination of pad 16 and bridge 18. Gap 15 enables gases within the underlying dielectric layer 11 to escape up towards and into the overlying second dielectric layer 13, thereby relieving pressure along the interface between dielectric layer 11 and metal layer 12. Conductive bridge 18 functions to electrically connect pad 16 with outer conductive layer 12 so that pad 16 may cooperate with layer 12 in terms of providing an AC grounding plane. The bridges 18 are primarily used in embodiments of the present invention where the signal lines carry high frequency signals (usually above about 200 MHz), where the electrical properties of the grounding plane become important. Bridges 18 are often not necessary for embodiments where lower frequency signal lines are employed, particularly where the diameter of the aperture 14 is less than approximately 400 μm. FIG. 10 shows a top plane view of a venting structure embodiment 100 which does not have a conductive bridge.

Referring back to FIG. 1, although gap 15 does not have as large a surface area as aperture 14 has, gap 15 does traverse a relatively long distance over underlying layer 11, from which it can collect vapors from underlying layer 11. Gap 15 is nearly as effective at collecting gases as aperture 14 would be without pad 16, and does not impact the performance of the signal lines near as much as aperture 14 does when used without pad 16 and bridge 18.

In one constructed embodiment of the present invention, aperture 14 has an outer diameter of 55 microns, gap 15 has a width W of approximately 7.5 microns, and conductive pad 16 has a diameter of 40 microns. The width of bridge 18 may be on the order of 5 to 10 microns, if it is desired to use a bridge. In this example, conductive pad 16 has an area which is 52% of the area encompassed by aperture 14, which is over 50% of the area of aperture 14.

It is important to maintain good planarity of dielectric layer 13, which is formed over conductive layer 12, since additional layers will be formed over layer 13. Small depressions will form at the surface of layer 13 in those portions of layer 13 which overlie gaps 15. If the width W of gap 15 is very large, the depth of the depression will be equal to the thickness of the underlying conductive layer 12. If the width of gap 15 is very small, the depth of the depression will be relatively small. In preferred embodiments of the present invention, the width of gap 15 is limited such that the depth of the depression does not exceed about one-half of the thickness of conductive layer 12. The depth of the depression is primarily dependent upon four factors: (1) the thickness of conductive layer 12, (2) the thickness of dielectric layer 13, (3) the gap width W, and (4) the physical properties of the dielectric, in the fluidized state, such as molecular weight, viscosity, and surface tension.

Using standard polyimides with thicknesses in the 2.5 μm–30 μm range and conductive layers with thicknesses in the range of 1 μm–10 μm, the inventors have found good planarization results by choosing a gap width W which does not exceed the following approximate maximum value:

$$\text{Maximum Width} = 10\,\mu m \times \frac{\text{(Thickness of dielectric layer 13)}}{\text{(Thickness of conductive layer 12)}}.$$

This preferred constraint on the gap width W ensures planarity in layer 13 so that the construction of venting structure 10 does not substantially affect the planarity of the final multilayer interconnect structure. Such planarity is important in ensuring the integrity of controlled impedance of signal lines that may be constructed over metal layer 12.

FIG. 3 is a top plan view of an array of venting structures 10 according to the present invention. The venting structures 10 are preferably distributed evenly across the surface of the substrate 5 to enable uniform venting of the gases in the underlying dielectric layer 11. It may be appreciated that a variety of array patterns may be used, such as a hexagonal close-pack pattern, a standard rectangular grid pattern, or a standard square grid pattern (which is shown in FIG. 3, where the pattern has been set at a 45° angle with respect to the substrate edges). The total area of the gaps 15 generally does not constitute more than about ten percent of the area encompassed by metal layer 12, and preferably does not constitute more than about two to five percent. In typical constructed embodiments, the total gap area is less than 1 percent of the total exposed area, being in the range of 0.1 percent and 1 percent. The venting structures may be spaced apart from one another at a distance which is equal to two to ten times the width (e.g., diameter) of the structure. As one example, the structures are 55 μm wide, and are spaced apart from one another by distance of between 250 μm (five-times) and 330 μm (six-times). In one constructed embodiment, the structures are approximately 55 μm wide, and are spaced apart from one another by distance of approximately 305 μm (5.55 times). In this constructed embodiment, layer 12 is approximately 5 μm to 8 μm thick, the surrounding dielectric layers are from approximately 5 μm to 15 μm thick, and gap 15 is approximately 7.5 μm wide, and bridge 18 is not used. In an embodiment which is currently being constructed and evaluated, the dimensions of the venting structure are the same, but the venting structures are spaced apart from one another by distance of approximately 153 μm (one-half of 305 μm). In this embodiment, layer 12 is approximately 5 μm thick, and the surrounding dielectric layers are from approximately 5 μm to 15 μm in thickness.

If subsequent AC grounding planes are constructed above layer 12, the patterns of venting structures may be stacked over one another to provide for good venting of gases.

The above dimensions are provided for polyimide materials in which the diffusivity of the water vapor (steam) is substantially the same in the vertical and lateral directions (so-called isotropic polyimide polymers), and in which the thickness of the polyimide is less than 30 μm. Most polyimide materials have isotropic diffusivity. However, some polyimide materials have anisotropic diffusivity where the water vapor diffuses faster in one direction than the other directions. Usually, the diffusivity values are larger in the lateral directions than in the vertical direction. The anisotropic characteristic may affect the selection of the vent hole size and pitch. For example, larger lateral diffusivities would enable the venting holes to be spaced further apart from that expected from the vertical diffusivity.

Although one bridge 18 per venting structure 10 is shown in FIGS. 1–3, it may be appreciated that the venting structure may include additional bridges, as demonstrated by the embodiment shown at 20 in FIG. 4. Venting structure 20 has substantially the same structure as venting structure 10 except that it includes two additional bridges 18 for a total of three such bridges. The bridges 18 are divided roughly equally around the circumference of aperture 14, and thereby divide up the original gap 15 into three gaps 15'. The additional bridges provide the advantage of increasing electrical conductivity to pad 16, which improves its ability to act as a grounding plane at high signal frequencies by enabling currents in the grounding plane to flow to pad 16 by more than just one direction. The additional bridges 18 take up relatively little additional area, and do not substantially affect the ability of the venting structure to collect and vent vapors. Additionally, in those constructed embodiments where bridges 18 are relatively thin and might be susceptible to failure, the additional bridges 18 serve to increase the reliability and yield of the electrical connection to pad 16.

It may be appreciated that aperture 14 may have other shapes beside the circular shape shown in FIGS. 1–4. For example, triangular, rectangular, pentagonal, hexagonal, septagonal, octagonal, etc. shapes may be employed. FIG. 5 shows an embodiment where the aperture (which is shown at 14') has a substantially square shape. In this embodiment, pad 16' may also have a square shape, and there may be four bridges 18' between pad 16' and a metal layer 12.

FIG. 6 shows another exemplary class of embodiments of venting structures according to the present invention. The figure shows a top plan view of a substrate having a metal layer 12 and an underlying dielectric layer 11. An array of venting apertures 44 is formed uniformly over the area of metal layer 12, each venting structure 44 comprising a slit having a width and a length which is at least three times its width, and preferably at least five times its width. FIG. 7 shows a partial cross-sectional view of the structure taken along the line 7—7 shown in FIG. 6. The slits 44 are preferably arranged in a regular pattern and their total area is at least 0.1 percent of the area encompassed by conductive layer 12, and typically in the range of 0.1 percent and 2 percent. The total area of slits 44 preferably does not comprise more than five to ten percent of the area encompassed by metal layer 12. In preferred embodiments, the length of each slit 44 is at least 10 times the width of the slit, with the length being 15 times the width in one embodiment. In one constructed embodiment of the present invention, the width of each slit is 10 μm, the length is 150 μm, and the slits are spaced from one another by approximately 200 μm on each side.

It may be appreciated that all of the venting structures described herein may be arranged in a non-uniform manner, for example when an irregular pattern is needed to accommodate the routing of vertical vias through metal layer 12, or the routing of via connections to metal layer 12. In such cases, the spacing between each slit 44 and an adjacent venting structure should not be changed by more than about a factor of two from that of a regular array pattern. In a regular array pattern of "N" venting structures which are uniformly distributed over an area "A", the distance "d" between each structure and its closest adjacent structures will be approximately equal to the square root of the area "A" divided by the number "N"

$$(d = \sqrt{A/N}).$$

In non-uniform patterns, it is best to keep the distances between adjacent structures within the range of $$d_1 = \tfrac{1}{2}\sqrt{A/N}$$

to $$d_2 = 2\sqrt{A/N}.$$

In some non-uniform patterns, it may not be readily apparent as to which structures would be considered to be the adjacent structures for a particular structure. Accordingly, the following guidelines may be followed, either alone or in combination:

1. If the area encompassed by layer 12 is "A" and the number of structures in this area is "N," the distance between each structure and the structure closest to it should be at least equal to approximately the square root of the quantity "A" divided by "4*N," which may be stated as $$\approx \tfrac{1}{2}\sqrt{A/N}.$$

2. The distance between each structure and the closest structure to it should not be greater than approximately the square root of "4A" divided by "N," which may be stated as $$\approx 2\sqrt{A/N}.$$

3. The average distance between a structure and its two closest structures should be in the range of between $$\approx \tfrac{1}{2}\sqrt{A/N} \text{ and } \approx 2\sqrt{A/N}.$$

Additionally, the venting structures should not be placed too far away from the peripheral edge of metal layer 12. In preferred embodiments, the distance between any point on the periphery and the closest structure should not be greater than approximately the square root of "4A" divided by "N," which may be stated as $$\approx 2\sqrt{A/N}.$$

If the construction of the dielectric and metals layers around the periphery of the metal layer 12 enables gases to be easily vented at the periphery, then this spacing distance may be substantially increased, such as to $$\approx 4\sqrt{A/N}$$

and above.

In FIG. 6, slits 44 are arranged in a regular pattern whereby their lengths are aligned to be parallel to a common axis. In the case of circular shaped substrates, it may be appreciated that the slits may be arranged in a radial manner. An example of one such arrangement is shown in FIG. 8. It may also be appreciated that a curvilinear shape may be given to the slits, as for example those shown in FIG. 9.

In order to minimize the effects that the venting structures may have on the controlled impedance and electrical characteristics of the signal lines constructed under or over layer 12 and the effects on planarization, the slits 44 may be chosen in the same manner for gaps 15, as described above (see the above formula on maximum width). For good electrical performance for signal lines operating at 200 MHz and above, the width of slits 44 and gaps 15 may be kept below about 20 μm.

For clarity, only small-area substrates have been shown in the figures. In practice, the substrates may be larger, typically being at least 4 centimeters (cm) on a side (rectangular), and can be 20 cm or more on a side. The density of venting structures according to the present invention may be as high as 1,000 to 1,500 structures per square centimeter, but the total gap/slit area may not comprise more than 1 to 10 percent of the area encompassed by metal layer 12, and preferably comprises between 0.1 and 5 percent of the area encompassed by metal layer 12. Embodiments of the present invention typically have at least 100 venting structures per square centimeter (which is at least 1,000 structures for a substrate having an area of 10 cm$^2$), and usually have at least 500 venting structures per square centimeter (which is at least 5,000 structures for a substrate having an area of 10 cm$^2$). Of course, as the number of venting structures per square centimeter is increased by a given factor, the dimensions of each individual structure should be decreased.

Embodiments of the present invention using approximately 1,050 venting structures per square centimeter have been constructed, and embodiments with over 4,000 venting structures per square centimeter are currently being built and evaluated.

While the present invention has been particularly described with respect to the illustrated embodiments, it will be appreciated that various alterations, modifications and adaptations may be made based on the present disclosure, and are intended to be within the scope of the present invention. While the invention has been described in connection with what is presently considered to be the most practical and preferred embodiments, it is to be understood that the present invention is not limited to the disclosed embodiments but, on the contrary, is intended to cover various modifications and equivalent arrangements included within the scope of the appended claims.

What is claimed is:

1. A multilayer structure comprising:
    a first dielectric layer disposed over a substrate which is more rigid than said first dielectric layer;
    a conductive layer having a first surface disposed in planar contact with said first dielectric layer, a second surface, and an aperture overlying a portion of said first dielectric layer, said aperture having a perimeter;
    a conductive pad disposed within the perimeter of said aperture and overlaying said first dielectric layer; and
    a second dielectric layer having a first surface disposed in planar contact with the second surface of said conductive layer and a second surface opposite to said first surface of said second dielectric layer, said second dielectric layer having a portion entirely overlying said aperture and said conductive pad such that said conductive pad is isolated from material disposed over the second surface of said second dielectric layer.

2. The multilayer structure of claim 1 further comprising at least one conductive path from said conductive pad to the conductive layer.

3. The multilayer structure of claim 1 wherein the conductive pad and the conductive layer have substantially the same thickness.

4. The multilayer structure of claim 1 wherein said conductive pad has an area which is at least approximately 30 percent of the area of the aperture.

5. The multilayer structure of claim 1 wherein said conductive pad has an area which is at least approximately 50 percent of the area of the aperture.

6. The multilayer structure of claim 1 further comprising one or more gaps in the conductive material between the perimeter of the aperture and the conductive pad, wherein said conductive layer has an average thickness of $T_c$, wherein said second dielectric layer has an average thickness of $T_D$, and wherein each of said one or more gaps has a width which does not exceed the quantity of approximately (10 μm)×($T_D/T_C$).

7. The multilayer structure of claim 1 further comprising:
    a gap in the conductive material between the perimeter of the aperture and the conductive pad; and
    wherein said second dielectric layer comprising a substantially flat surface and a depression in said surface located over said gap, said depression having a depth below the plane of said surface; and wherein the depth of said depression does not exceed about one-half of the thickness of the conductive layer.

8. The multilayer structure of claim 1 further comprising one or more gaps in the conductive material between the perimeter of the aperture and the conductive pad, and wherein each of said one or more gaps has a width which does not exceed twenty microns.

9. The multilayer structure of claim 1 wherein said aperture has a substantially circular shape.

10. The multilayer structure of claim 1 wherein said aperture has a substantially rectangular shape.

11. The multilayer structure of claim 1 wherein said conductive layer comprises a metal, and wherein said conductive pad comprises a metal.

12. A multilayer structure comprising:
   a first dielectric layer disposed over a substrate which is more rigid than said first dielectric layer;
   a conductive layer having a first surface disposed in planar contact with said first dielectric layer, a second surface, and an area A of at least 10 square centimeters;
   a plurality N of apertures formed in said conductive layer, N being at least 1,000, each aperture overlying a portion of said first dielectric layer;
   a plurality of conductive pads, each pad being disposed within a respective aperture and overlying a portion of said first dielectric layer; and
   a second dielectric layer having a first surface disposed in planar contact with the second surface of said conductive layer and a second surface opposite to said first surface of said second dielectric layer, said second dielectric layer having a portion entirely overlying a plurality of said apertures and the respective conductive pads disposed therewithin such that said respective conductive pads are isolated from material disposed over the second surface of said second dielectric layer.

13. The multilayer structure of claim 12 further comprising a plurality of conductive paths, at least one said conductive path being between each said conductive pad and the conductive layer.

14. The multilayer structure of claim 12 wherein the conductive pads and the conductive layer have substantially the same thickness.

15. The multilayer structure of claim 12 wherein the total area of said apertures less the total area of said conductive pads is less than approximately 10 percent of the area encompassed by said conductive layer.

16. The multilayer structure of claim 15 wherein the total area of said apertures less the total area of said conductive pads is at least approximately 0.1 percent of the area encompassed by said conductive layer.

17. The multilayer structure of claim 12 wherein the distance between each aperture and its closest aperture is at least equal to the square root of $(A/4N)$.

18. The multilayer structure of claim 12 wherein the distance between the periphery of said conductive layer and the closest aperture is not greater than the square root of $(4A/N)$.

19. The multilayer structure of claim 12 wherein said apertures are arranged in a regular pattern with respect to one another.

20. The multilayer structure of claim 12 wherein a plurality of said conductive pads each has an area which is at least approximately 30 percent of the area of the aperture in which it is disposed.

21. A multilayer structure comprising:
   a first dielectric layer disposed over a substrate which is more rigid than said first dielectric layer;
   a conductive layer having a first surface disposed in planar contact with said first dielectric layer, a second surface, and an aperture overlying a portion of said first dielectric layer, said aperture having a perimeter;
   a conductive pad disposed within the perimeter of said aperture and overlaying said first dielectric layer, said conductive pad being electrically isolated from said conductive layer; and
   a second dielectric layer having a first surface disposed in planar contact with the second surface of said conductive layer and a second surface opposite to said first surface of said second dielectric layer, said second dielectric layer having a portion entirely overlying said aperture and said conductive pad such that said conductive pad is isolated from material disposed over the second surface of said second dielectric layer.

22. The multilayer structure of claim 21 wherein said conductive pad has an area which is at least approximately 50 percent of the area of the aperture.

23. The multilayer structure of claim 21 further comprising a gap in the conductive material between the perimeter of the aperture and the conductive pad, and wherein said gap has a width which does not exceed twenty microns.

* * * * *